United States Patent [19]

Hershberger et al.

[11] Patent Number: 5,757,656

[45] Date of Patent: May 26, 1998

[54] METHOD FOR ROUTING BREAKOUTS

[75] Inventors: John E. Hershberger, Mountain View; John R. Egan, San Jose; Robert Mark Sumner, Sunnyvale, all of Calif.

[73] Assignee: Mentor Graphics, Wilsonville, Oreg.

[21] Appl. No.: 576,631

[22] Filed: Dec. 20, 1995

[51] Int. Cl.$^6$ ................................................ G06F 17/50
[52] U.S. Cl. ........................................... 364/491; 395/500
[58] Field of Search ................................ 364/488–491, 364/578, 500

[56] References Cited

U.S. PATENT DOCUMENTS

| | | | |
|---|---|---|---|
| 5,019,992 | 5/1991 | Brown et al. | 364/488 |
| 5,513,119 | 4/1996 | Moore et al. | 364/491 |
| 5,548,747 | 8/1996 | Rudolph | 395/500 |
| 5,581,738 | 12/1996 | Dombroski | 395/500 |

OTHER PUBLICATIONS

"Computational Geometry: An Introduction," 1985, pp. 121–122.

Cormen, T., Leiserson, C., and Rivest, R., "Computational Geometry," *Introduction to Algorithms*, 1990, p. 914.

Darnauer, J., and Dai, W., "Fast Pad Redistribution from Periphery–IO to Area–IO," *IEEE*, 1994, pp. 38–43.

Hershberger, J., and Suri, S., "Applications of a Semi–Dynamic Convex Hull Algorithm," *BIT*, 1992, pp. 249–267.

*Primary Examiner*—Kevin J. Teska
*Assistant Examiner*—Ayni Mohamed
*Attorney, Agent, or Firm*—Klarquist Sparkman Campbell Leigh & Whinston LLP

[57] ABSTRACT

A computer-assisted method for routing breakouts includes finding a matching for a group of pins and vias, and then routing paths between matching pin-via pairs. The matching is computed efficiently and quickly by creating convex hull data structures to represent the pins and vias, and then computing a common tangent from these convex hull structures. The endpoints of the common tangent comprise matching pin-via pairs. A matching pair is routed to find a path between a pin and via pair that achieves predefined design constraints. The method can be extended to routing wire bond connections as well.

9 Claims, 11 Drawing Sheets

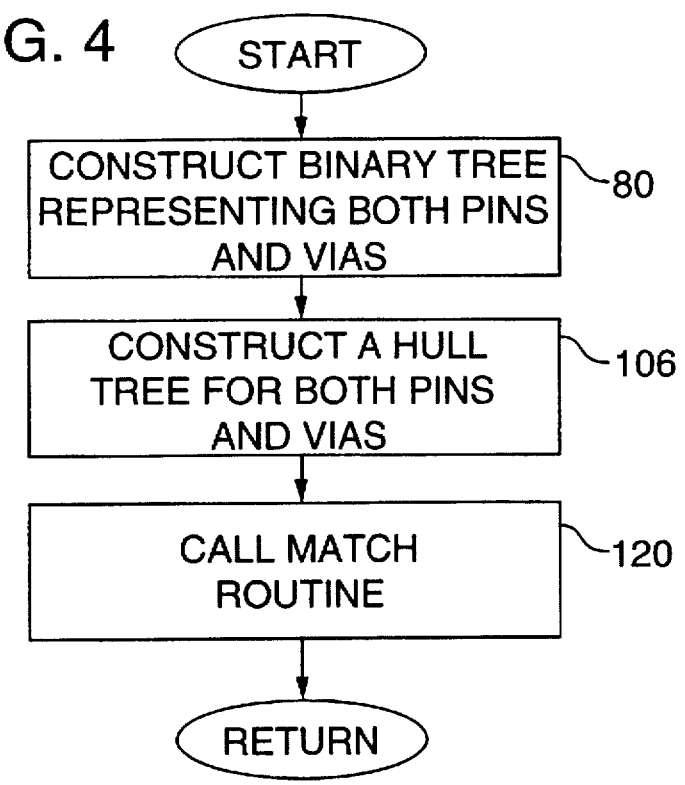
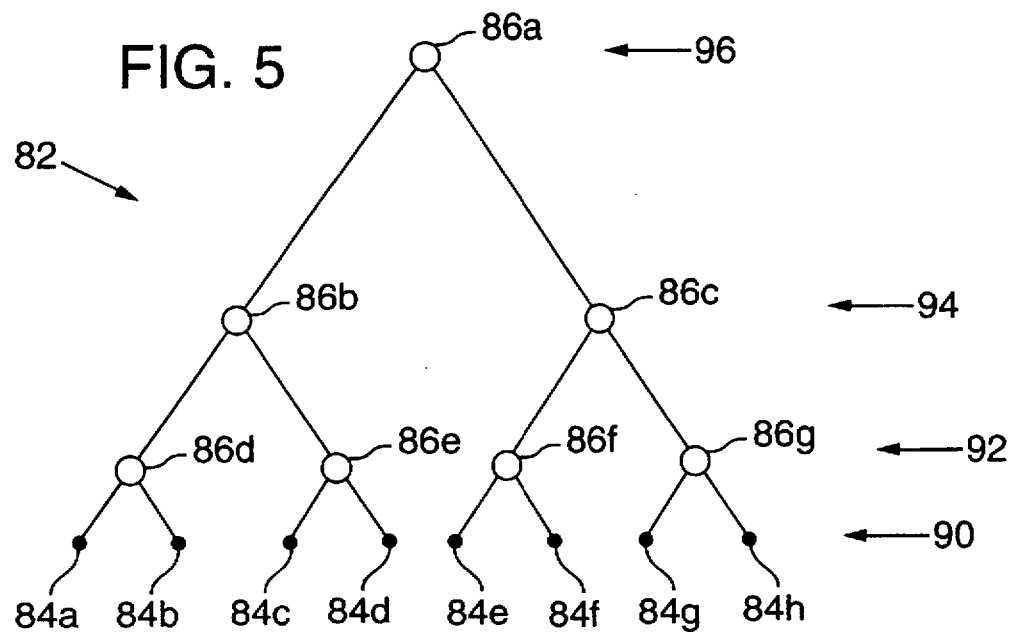

METHOD FOR ROUTING BREAKOUTS

This invention was made with government support under ARPA Contract No. MDA972-93-C-0045, awarded by the Advanced Research Projects Agency. The government has certain rights in the invention.

FIELD OF THE INVENTION

The invention generally relates to computer-assisted design of electronic circuits and more specifically relates to computer-assisted routing.

BACKGROUND OF THE INVENTION

In the field of electronic design automation, the term "routing" refers to a computer-assisted technique for finding wiring or trace paths to interconnect components, such as components in a multi-chip module or on a printed circuit board. In modern electronic design, engineers typically rely on software tools for placement and routing of components. Given a layout of components on a substrate or circuit board, the objective of a routing program is to route interconnect paths among components while minimizing total path length and meeting other design constraints. Typical design constraints include physical constraints such as the size of the pins, traces, and routing vias, and electrical constraints such as signal delay and signal integrity.

From the standpoint of software design, a routing tool should achieve a routing solution that satisfies the design constraints and minimizes processing time. With the increasing complexity of today's circuit designs, the routing problem becomes more difficult. Pin counts and the density of components are increasing while component sizes are decreasing. In multi-chip modules for example, a number of components are placed as close together as possible within a single package. Adding to the complexity of routing, the mounting surface can include several thermal and routing vias. A thermal via is used to draw heat from components, while a routing via is used to route paths vertically through the mounting surface to other layers.

One form of routing, called "breakout" routing, refers to routing paths between pins and routing vias. The breakout path from a pin to a routing via allows the pin to be connected to a routing layer; the breakout path lies on a single layer. The breakout routing problem is different than routing among components in that a pin can be routed to any via. Of course, there are certain constraints in how these paths are routed. The objective is to find a via for each pin so that none of the breakout paths cross, and the total path length is minimized.

Perhaps the most widely used approach to solve the breakout routing problem is to use a detailed routing program to find a minimum length matching between pins and vias. A minimum length matching guarantees that none of the resulting routing paths overlap. Unfortunately, finding a minimum length matching consumes a significant amount of processing time using conventional routing programs. Typical routing programs are designed to find a routing path between pairs of specified coordinates. In the context of breakouts, the routing program selects a target via, perhaps the closest to the pin, and then routes a path to that target via. Continuing with each pin and via pair, the routing program routes a single path at a time. To minimize total path length, the routing program must swap routing paths several times, which adds additional delay.

The attempts to design an effective breakout routing tool based on this approach have failed because conventional routing programs take too long to minimize total path length. While it is known in theory that the minimum total path length will guarantee a non-crossing routing of breakouts, this objective is very difficult to achieve using conventional routing techniques. Routing programs known to the inventors must swap pin and via routing paths for several iterations and may never converge to an acceptable solution.

Some approaches to the breakout routing problem incorporate placement of a via with the routing of pin-via pairs. In these approaches, each breakout routing path is routed separately, culminating in placement of a via in an acceptable location. Examples of this approach include 1) routing away from a pin until a via is dropped; 2) generating a straight line route until an acceptable position for a via is located; and 3) generating a variety of routing patterns until an acceptable position for a via is located. These approaches require that each breakout be routed one at time in a serial fashion and also include the additional overhead of placing a via.

Combining via placement with routing degrades performance. Via placement requires additional processing to evaluate whether a given location is an acceptable position for a via. The via must be placed so that it does not violate any design constraints such as minimum spacing from other routing vias, thermal vias, routing paths or components on the breakout layer or any other layer. The evaluation of these constraints slows down the breakout routing process and can lead to an inferior routing layout.

Another proposed solution to the breakout routing is to assume a uniform distribution of vias around the pins. This approach, which is discussed in more detail in Darnauer and Dai, "Fast Pad Redistribution From Periphery-IO to Area-IO" IEEE, 0-8186-5560, July, 1994, requires vias to be evenly distributed in rows parallel to rows of pins. Given this even distribution, a mapping between pins and corresponding vias follows a regular pattern: for example, a first pin maps to a first via in row one, a second pin maps to a first via in row 2, and third pin maps to a first via in row 3; and then starting over, a fourth pin maps to a second via in row 1, fifth pin maps to a second via in row 2, etc. The result is a uniform number of paths between each pair of vias in each row.

This approach takes advantage of the equal and regular spacing of pins and vias to route a uniform number of paths between each gap between vias. Since this approach only applies to uniformly distributed vias, it is very limited. If the vias are not distributed in even rows relative to an even distribution of pins, this approach experiences problems.

Since the breakout routing problem has not been adequately solved using present techniques, there is a need for an improved method for routing breakouts.

SUMMARY OF THE INVENTION

The invention provides an improved method for breakout routing. One embodiment of the invention takes a novel approach to the breakout routing problem by applying the geometric properties of a convex hull. A matching of pins and vias can be found by finding the common tangent between upper convex hulls representing the pins and vias. This matching can then be used to route non-crossing traces between pin-via pairs.

One embodiment of the invention is a computer-assisted method for routing breakouts. Convex hull structures are created to represent the pins and vias. The endpoints of the common tangent comprising a matching pin-via pair are found using these convex hull structures. After a matching pin-via pair is found, the matching pin and via are removed from their respective convex hull structures, and the structures are reconstructed. Routing paths can be routed between matching pin and via pairs.

Alternative embodiments of the invention can include additional pre-processing and post-processing steps. For instance, the pins and vias can be partitioned to simplify the routing problem. In addition, pin-via pairs can be swapped where necessary to reduce the total path length of the breakout routing paths.

The invention has several advantages over known techniques. It allows circuit designers to find a solution to a variety of breakout routing problems relatively quickly. Instead of routing each breakout individually, the invention enables a matching of a group of pins and vias. This matching significantly simplifies routing because traces can easily be routed between the matching pin and via pairs. Moreover, this approach reduces processing time further by decreasing or eliminating pin-via swapping.

Further advantages and features of the invention will become apparent with reference to the following detailed description and accompanying drawings.

BRIEF DESCRIPTION OF THE DRAWINGS

FIG. 4 is a flow diagram illustrating the steps performed in the matching process in an embodiment of the invention.

FIG. 5 illustrates an example binary tree structure used to store information about pins and vias in an embodiment of the invention.

DETAILED DESCRIPTION

Figure 1:
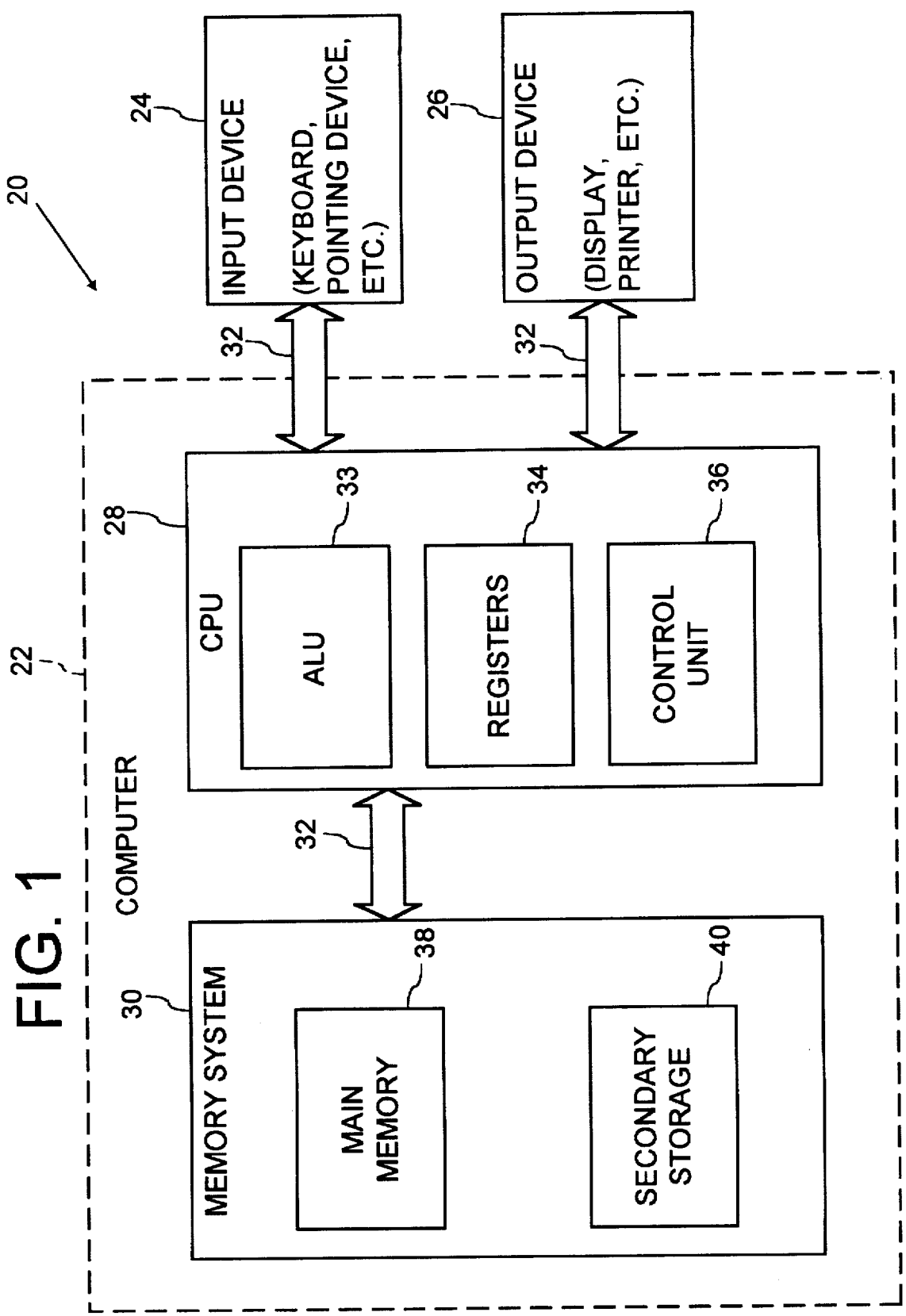
FIG. 1 is a block diagram illustrating a computer system, which serves as an operating environment for an embodiment of the invention.

FIG. 1 is a block diagram illustrating a computer system 20, which serves as an operating environment for an embodiment of the invention. Computer system 20 includes as its basic elements a computer 22, input device 24 and output device 26.

Computer 22 generally includes at least one high speed processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use electrical, magnetic, optical or other recording material. Main memory 38 stores programs such as a computer's operating system and currently running application programs. Main memory 38 also includes video display memory for displaying images through a display device.

Input device 24 and output device 26 are typically peripheral devices connected by bus structure 32 to computer 22. Input device 24 may be a keyboard, modem, pointing device, pen, or other device for providing input data to the computer. Output device 26 may be a display device, modem, printer, sound device or other device for providing output data from the computer.

An embodiment of the invention is described below with reference to symbolic representations of instructions that are performed by a computer system 20. These instructions are sometimes referred to as being computer-executed. The invention can be implemented in a program or programs, comprising a series of instructions stored on a computer-readable medium. The computer-readable medium can be any of the devices, or a combination of the devices, described above in connection with memory system 30.

An operating system, stored in memory of the computer system, can provide a number of low level functions to support the operation of an embodiment of the invention. In general, the operating system is responsible for controlling the allocation and usage of hardware resources such as memory, CPU time, disk space, and peripheral devices. As is well-known, operating systems provide such low level functions as module (process and dynamic link library) management, scheduling, interprocess messaging, memory management, file system management, and graphical user interface support.

It should be understood that FIG. 1 is a block diagram illustrating the basic elements of a computer system; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which one or more of these parts of the CPU are integrated together, such as in a microprocessor. Moreover, the number and arrangement of the elements of the computer system may be varied from what is shown and described in ways known in the art.

The method for breakout routing according to the invention can be implemented in any of a number of well-known computer systems. An embodiment of the invention is implemented as part of a design layout system, which includes a number of design programs ported to Sun Workstations for the Sun OS and Solaris Operating Systems, and to the Hewlett-Packard PA-RISC workstation. In addition to these specific platforms, alternative embodiments can be ported to a variety of UNIX workstations. Similarly, they can be ported to personal computers (PC), such as IBM-AT compatible computers or computer systems based on the 80386, 80486, or Pentium processors from Intel Corporation. The above systems serve as examples only and should not be construed as limiting the type of computer system in which the invention may be implemented.

In one embodiment of the invention, the method for breakout routing has three primary stages: 1) a pre-processing stage; 2) a pin-via matching stage; and 3) a post-processing stage. The pre-processing stage can include a number of steps to prepare pin and via data for the matching stage. The pin-via matching stage involves finding non-crossing, routing paths between pairs of pins and vias. In this embodiment, the process of finding a non-crossing pin-via pair is sometimes referred to as "matching." Finally, the post-processing stage can include additional processing of the results from the pin-via matching stage to minimize total routing length and to maximize the satisfaction of design constraints.

Figure 2A:
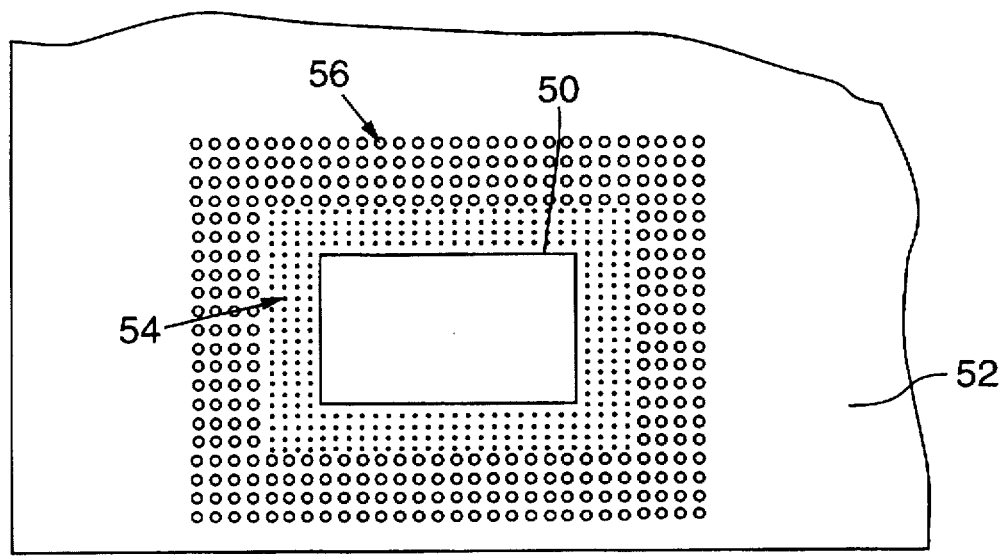
FIGS. 2A and 2B illustrate an example of the breakout routing problem.

FIG. 2A is a top view of a component 50 on a placement surface 52 illustrating an example of the breakout routing problem. The component 50 has a number of pins (several being numbered as 54) that must be routed to vias (several being numbered as 56) on the placement surface 52. To solve the problem using computer-assisted routing, pins 54 and vias 56 in a design are represented by X and Y coordinates in a rectangular coordinate system and these coordinates then serve as inputs to the breakout routing routines.

Figure 2B:
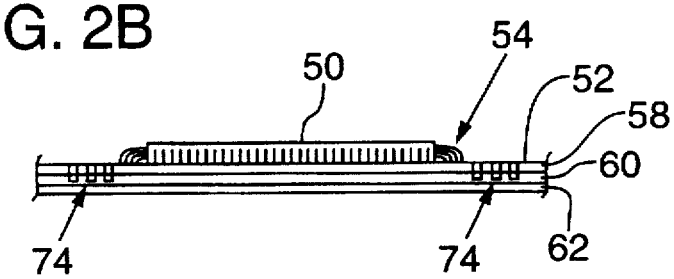

FIG. 2B is a side view of the component 50, routing vias 56 pass through a first routing layer 58 and terminate at second routing layer 60. Interconnects between the component 50 and other components can be routed on this second routing layer 60. Another routing layer 62 is shown below the first two. This is only a simple example illustrating the relationship between pins and routing vias. Much more complex routing problems are more typical.

In most cases, the coordinates of the pins and vias lie in a single plane. However, it is possible to route breakouts in different routing layers. If this is the case, then the breakout problem can be addressed by routing the layers separately. Once the relative positions of the pins and vias are captured, the coordinates of the pins and vias can be rotated, scaled, and partitioned to prepare the data for the matching stage.

In one embodiment, placement of vias is performed as a pre-processing step. Vias are positioned based on a number of objectives. One objective is to place the vias as close to the associated component as possible to minimize total surface area of the design layout. Another objective is to place the vias so that one or more breakout routing paths can pass through the spaces. Another objective, which is closely related to the first two, is to satisfy a variety of design constraints. For example, the spacing among vias and other components has to meet a predefined minimum distance. Also, vias must be placed so that they do not collide with other components, routing paths, thermal vias, etc.

In one embodiment, the computer is programmed to place the vias so that the design objectives outlined above are satisfied. Before locating vias, the system evaluates a target area to ensure that nothing is in the way. Vias are then placed to satisfy spacing requirements as set forth above.

In some cases, pre-processing of the pin and via data can include eliminating some vias such that the number of pins is equal to the number of vias. For a typical design, the number of vias is greater than or equal to the number of pins. Where the number of vias exceeds the number of pins, vias can be discarded uniformly until the number of target vias equals the number of pins.

Figure 3:
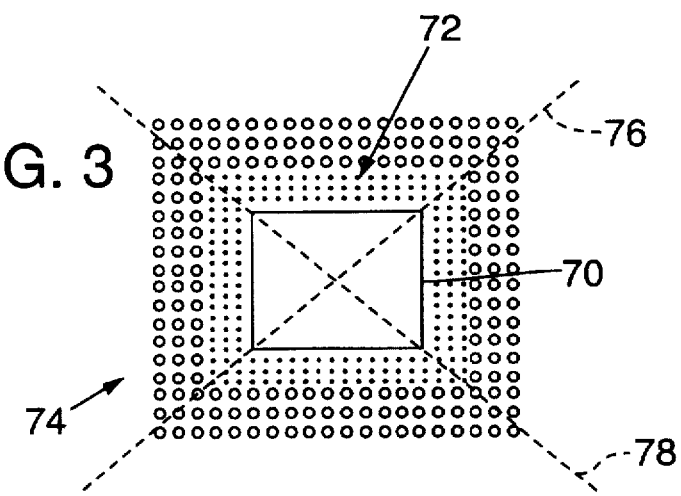
FIG. 3 illustrates how an example pin and via layout can be partitioned as a pre-processing step.

Pre-processing can also include partitioning the design into smaller, more manageable pieces that can be processed in separate pin-via matching stages. For example, FIG. 3 illustrates how an example design can be partitioned, in this case into quarters. In this example, a component 70 having a number of pins (some indicated as 72) and vias (some indicated as 74) around its periphery is partitioned by subdividing or bisecting the component 70 with diagonal lines 76, 78 as shown. As will become apparent from the description of the matching stage below, partitioning can help reduce the total routing length of the paths because it confines the target vias for a number of pins to a more limited area. Depending on the geometry of the pins, vias, and component(s), partitioning can be performed in a variety of ways and is not limited to diagonal subdivisions. Partitioning is particularly useful when pins and vias can be separated into groups such that each group of pins is associated with the geographically nearest group of vias. When the vias are in a substantially uniform arrangement about a rectangular component, pins and vias can be partitioned by diagonal lines through the component.

After completing any pre-processing, the matching process can begin. FIG. 4 is a flow diagram illustrating the steps performed in the matching process.

Given a set of pins and vias, the first step 80 is to read the coordinates of the pins and vias from memory and construct a binary tree to store pins and via data. The binary tree structure provides an efficient structure for searching and manipulating this data. FIG. 5 illustrates an example binary tree structure 82. The coordinates of the pins and vias are stored as leaves 84a–h of the tree in left to right order. The binary tree has "logarithmic" height because the number of nodes 86a–g at each level 90–96 above the leaves decreases by a factor of 2.

Figure 6:
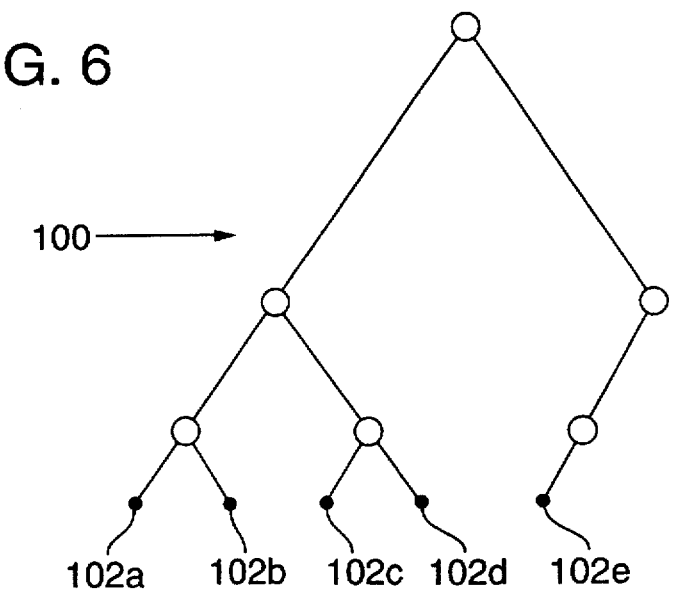
FIG. 6 illustrates another example of a binary tree structure.

If the number of pins and vias is not a power of two, then only the ancestor nodes of the leaves containing a pin or via are maintained. FIG. 6 illustrates an example of a binary tree 100 where the number of pins and vias 102a–e is only five. Since 5 is not a power of 2, only the portion of the tree including the leaves 102a–e and their ancestors needs to be maintained.

Returning to FIG. 4, the next step 106 is to construct convex hull structures called "hull trees" to represent upper convex hulls for pins and vias, respectively. A convex hull for a set of points in a plane is the smallest convex polygon formed from line segments enclosing the points. The vertices of the polygon are members of the set of points, and each of the angles formed by the segments is convex.

Figure 7:
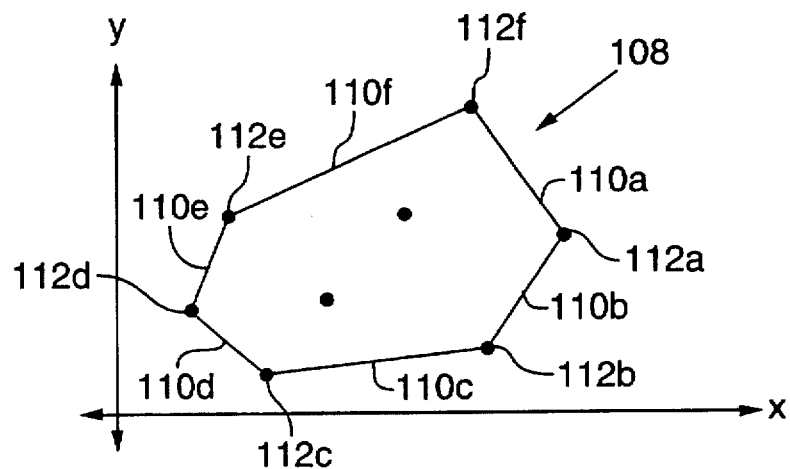
FIG. 7 illustrates an example of a convex hull.

FIG. 7 illustrates an example of a convex hull 108. Conceptually, one can imagine the formation of the convex hull 108 as wrapping a ribbon around all of the points in a set and then pulling it tight. The end result is a polygon 108 comprising line segments 110a–f through the outer-most points 112a–f in the set.

Figure 8:
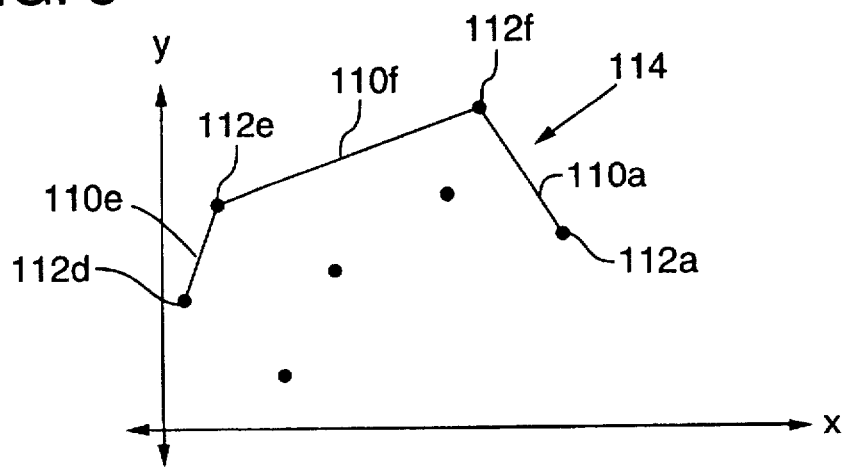
FIG. 8 illustrates an example of an upper convex hull.

An upper convex hull is the upper portion of the full convex hull. More specifically, the upper convex hull comprises only the vertices located above the left-most and right-most vertices 112d, 112a. FIG. 8 illustrates an upper convex hull 114 drawn from the point set of FIG. 7.

The upper convex hull can be used to pair up pins and vias defining a set of non-crossing routing paths. The geometric properties of an upper convex hull guarantee that the common tangent between separate upper convex hulls representing the pins and vias produces a non-crossing path between matching pin-via pairs. For more information about the use of convex hulls to solve a geometric matching problem generally, please see: Hershberger, J., Suri, S., "Applications of a Semi-Dynamic Convex Hull Algorithm," BIT Vol. 32, pp. 249–267, 1992.

To find matching pin-via pairs in this implementation, upper convex hulls representing the pins and vias are constructed first. After the upper convex hulls are computed for the pins and vias, a match routine finds matching pin-via pairs for all of the pins and vias in the set as shown in step 120 of FIG. 4. The routine finds matching pairs one at a time. After each matching pair is found, pin and via endpoints of the common tangent are deleted from the active list, and upper convex hulls are reconstructed for the remaining pins and vias. The process of finding a common tangent and removing matched pin-via pairs continues until no more pins and vias remain.

The upper convex hulls for the pins and vias are computed and then stored in a binary tree structure. We begin first by describing the binary tree data structure used to store the upper convex hulls. Since the upper convex hull structures are constructed similarly for both pins and vias, it is simpler to use the terms "point" or "points" to refer to the location of the pins and vias in a rectangular coordinate system. The description of the upper convex hull data structure applies equally for both pins and vias.

The convex hull data structures, or more simply, "hull trees," can be constructed from the binary tree representing both the pins and vias. Each leaf of the hull tree for the pins represents a pin, and similarly, each leaf of the hull tree for the vias represents a via. The leaves of the pin and via hull trees map to corresponding leaves in the binary tree representing the entire, ordered set of pins and vias. Likewise, the nodes of the hull trees map to corresponding nodes in the binary tree representing the ordered set of pins and vias.

The nodes of a hull tree represent the upper convex hull for the descendant leaves of the node. For example, the root node of a hull tree represents the upper convex hull for all points in a set. Descendant nodes located lower in the hull tree represent the upper convex hull for the descendant leaves of the respective nodes. Though storing an entire hull at each node would be convenient for searching and manipulating the hull tree, it unnecessarily expands the amount of memory required to store the hull tree. To reduce the amount of memory required, only a portion of an upper convex hull is preferably stored at a node in the hull tree in this embodiment.

Figure 9:
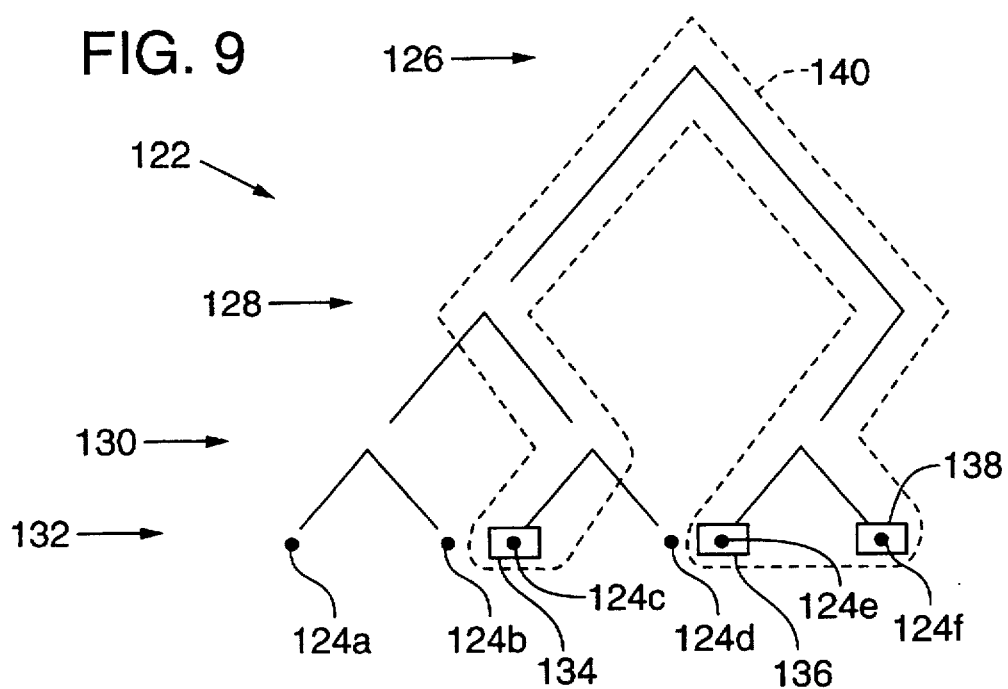
FIG. 9 is an example of a binary tree structure drawn to illustrate how an upper convex hull is stored in a hull tree structure in an embodiment of the invention.
Figure 10A:
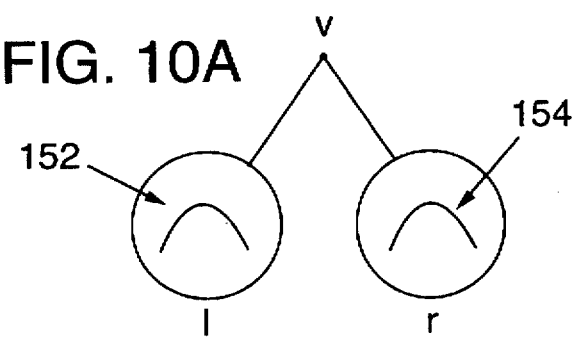
FIGS. 10A–D illustrate how data is stored in a hull tree in an embodiment of the invention.
Figure 10B:
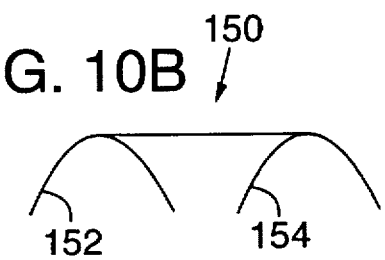
Figure 10C:
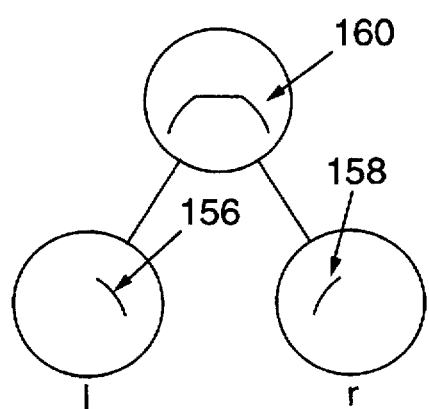
Figure 10D:
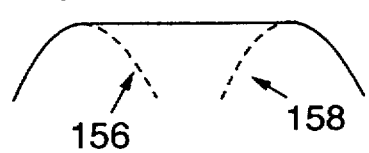

FIG. 9 will help illustrate how an upper convex hull is stored in a hull tree structure. The binary tree 122 in FIG. 9 includes a total of six points 124a–f. There are four levels 126–132 in this tree starting at the highest or root node 126 and counting down to the leaves in the tree 132. To illustrate the concept of a subgraph, we assume that the pins are the points 124c, 124e, 124f enclosed by boxes 134, 136, 138. The portion of the binary tree 122 enclosed by dashed lines 140 is a subgraph representing the pins. Note that the dashed lines enclose each of the pins as well as all of their ancestors.

Information about the descendants of a node can be stored at the node. For example, nodes in a hull tree can store data representing the upper convex hull of the points located at the descendant leaves of the respective nodes. Although possible, rather than storing an entire hull at each node, points in a hull tree are preferably stored as follows. A point is stored in a hull tree at the highest node where it is a vertex of an upper convex hull.

FIGS. 10A–D will help illustrate how data is preferably stored in a hull tree. Let l and r denote the left and right children of a node v. The upper convex hull for the node v can be found by finding the common tangent 150 of the upper convex hulls 152, 154 at the left and right children of v. There is a hull tree for the descendant leaves of l (152) and one for the descendant leaves of r (154). However, only a portion of these hull trees is stored at l and r. This portion is the fragment 156, 158 of the hull tree that is hidden by the common tangent 150 of the hull trees at l and r. Using the common tangent 150 and the hull tree or fragment stored at a parent node 160, the entire hull tree at each node can be constructed. The root of the hull tree stores the entire upper convex hull 160 for the points in the descendant nodes.

The nodes of the hull tree data structure have two fields. The first is a pointer to a doubly-linked list of points, denoted by chain(v), which represents the upper hull for the node or its hidden fragment as described above. The second field, denoted by tan(v), represents the common tangent of the upper hulls at the left and right children of the node by pointers to its endpoints in chain(v). Since chain(v) represents the upper hull for the node v, and chain(l) and chain(r) represent the hidden fragments of the upper hulls at nodes l and r produced while constructing the upper hull at node v, then tan(v) can be used to construct the upper hulls at nodes l and r. As the entire upper hull is constructed, the end points of tan(v) may be spliced out of chain(v) and moved to chain(w) for some other node w (w is an ancestor of v). The pointers in tan(v) are not invalidated by this splicing, and whenever chain(v) is stored to represent the upper hull at node v, tan(v) can be used to form the upper hulls at the left and right children nodes.

At each node, a hull tree keeps track of the total number of active pins or vias residing in descendant leaves of the node. The term "active" refers to unmatched pins and vias. The number of points below a node can be used to split the set of pins and vias. This set-splitting process is described further below.

In building the hull tree data structures for the pins and vias, the upper convex hull for the nodes in the respective hull trees is computed starting with the bottom nodes of the tree. Since the binary tree representing all pins and vias stores the pins and vias in order relative to their x-coordinates, the upper convex hulls for the left and right children of a node are always separated by a vertical line. The upper convex hull for nodes in the respective hull trees is computed by finding the common tangent of the upper convex hulls at the left and right child nodes.

At the bottom of a tree, the leaves simply represent points. The common tangent through a pair of points is simply a line.

Moving up the tree, the routine for building the hull tree structures finds a common tangent by marching a pair of reference points from left to right along the left and right upper convex hulls. The routine uses the observation that the two hulls have the same slope at the endpoints, l and r, of the common tangent. More precisely, the minimum slope of the edges left of l on the left hull and left of r on the right hull is greater than the maximum slope of the edges to the right of l on the left hull and right of r on the right hull. The common tangent is computed by starting reference points l' and r' at the leftmost points of the left and right hulls (which also have the same slope), then marching l' and r' forward while maintaining the invariant that the slope at l' is the same as that at r', until l' and r' reach the tangent endpoints l and r.

When a common tangent is found, it is used to build the upper convex hull for the node. The upper convex hulls at the child nodes are cut at the endpoints of the common tangent, and the fragments hidden by the new upper convex hull are stored in the child nodes.

Figure 11:
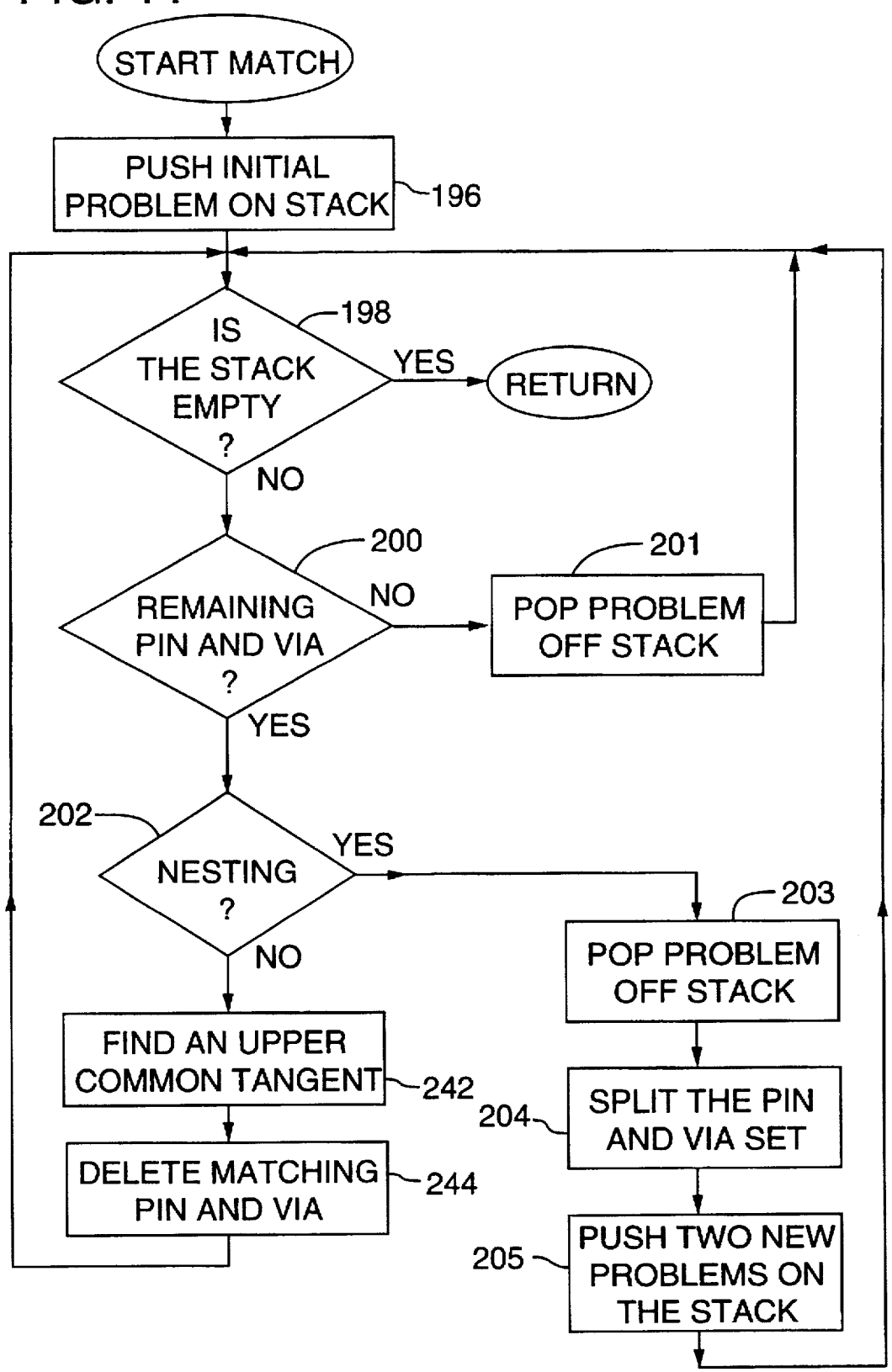
FIG. 11 is a flow diagram illustrating steps executed to match pins and vias in an embodiment of the invention.

Once the upper convex hulls for the pins and vias have been constructed, the common tangent between the two upper convex hulls can be used to find a matching pin-via pair. FIG. 11 is a flow diagram illustrating the steps of a match routine in an embodiment of the invention.

The match routine makes iterative calls until a match is found for each pin and via. The match routine finds matching pairs of pins and vias by finding the endpoints of the common tangent between an upper convex hull representing the pins and an upper convex hull representing the vias. As the match routine identifies a matching pin via pair, it deletes the pin and via from their respective hull trees, reconstructs the hull trees for any remaining pins and vias, and then continues. This particular approach works only when the pins and vias are not nested. To address this constraint, the match routine splits the sets of pins and vias and creates two new matching problems. The two new matching problems are placed on a stack, in this implementation, and handled one at a time. The details of this approach are described further below.

When another routine initially calls the match routine with a matching problem, the match routine places the problem on a stack as shown in step 196. The next step illustrated in FIG. 11 is decision step 198, which reflects that the match routine ends when no more problems are on the stack. As long as there are matching problems on the stack, the match routine proceeds with the problem at the top of the stack.

If there are remaining pins and vias to be matched for the current matching problem, the match routine proceeds to attempt to find a match as shown in decision step 200. Otherwise the routine pops the current problem off the stack and checks whether any matching problems remain on the stack.

The next step, illustrated as decision step 202, represents the determination whether the coordinates representing the pins and vias are nesting. Since this method applies to the upper convex hull, the routine only determines whether the pin and vias are nesting in one dimension. That is, it determines whether the left-most and right-most point remaining are both pins or both vias. If this is the case, then one set of pins or vias encloses the other.

If it is determined that pins and vias are nesting, a non-nesting grouping of pins and vias must be found. First, the routine pops the current problem off the stack (step 203) and then proceeds to split the pin and via set as reflected in step 204. The result of the split routine is two new matching problems, which are pushed onto the stack as shown in step 205. To guarantee that the stack size is at most logarithmic, the larger matching problem is always pushed first in this implementation.

Conceptually, the process of splitting the pins and vias to find a non-nesting grouping occurs as follows. A vertical line is swept from left to right across the pins and vias, and the differences between the number of pins and the number of vias on the left side of the line is continuously maintained. When a vertical line is found where the difference is zero, the sets of pins and vias are split at the line, and upper convex hulls are constructed for the new sets.

When the number of pins is not equal to the number of vias, the splitting condition is more general. Suppose the number of pins equals P, the number of vias equals V, and V is greater than or equal to P. Let $P_l$ and $V_l$, be the number of pins and vias, respectively, left of the line. The sets if pins and vias are split only if $V_l$ is greater than or equal to $P_l$, and $(V-V_l)$ is greater than or equal to $(P-P_l)$.

Figure 12:
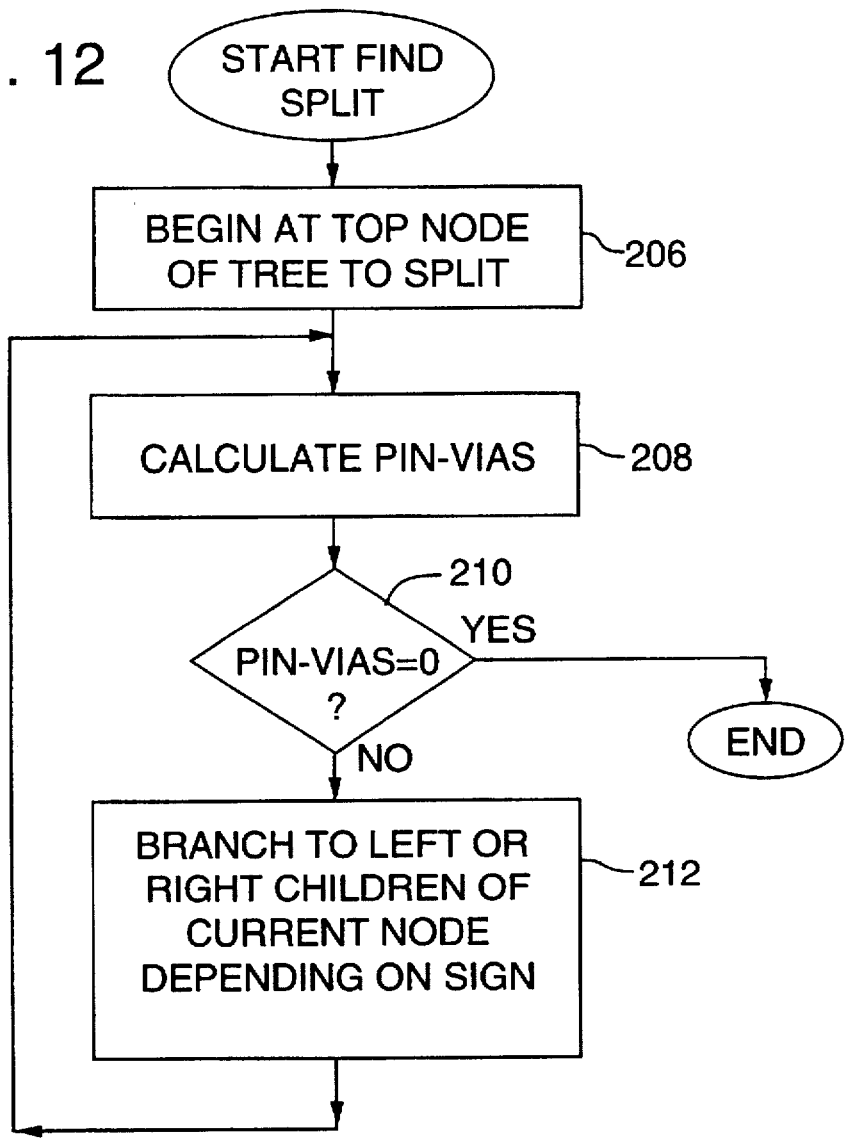
FIG. 12 is a flow diagram illustrating the steps executed in splitting a hull tree.

To implement this set-splitting function in this embodiment, the process illustrated in FIG. 12 is performed on the hull trees representing the active pins and vias. The process of finding a split where the number of pins and vias is equal begins at the top node of the binary tree to be split as shown in step 206. For example, if the pins and vias are nesting in the first iteration of the match routine, the process of finding a split of the set begins at the root node of the hull trees representing the pins and vias. For subsequent splits, however, the process begins at the highest node of the pin and via hull trees to be split.

The process includes traversing corresponding nodes of the pin and via hull trees to find a node where the number of pins minus the number of vias located to the left of the node is equal to zero. Step 208 represents the calculation of pins minus vias at a node. The number of pins to the left of a node is determined from the left child node of the node currently being visited plus the number of pins to the left that are not descendants of the current node, calculated as described below. Since the hull trees are constructed from the binary tree representing both the pins and vias ordered left to right, the left child nodes of the pin and via hull trees include the number of pins and vias, respectively, to the left of the current node.

So long as the number of pins minus the number of vias is not equal to zero, the splitting routine continues traversing the tree as follows (210). Assuming that the pins enclose the vias, the routine branches to the left if the pins minus the vias is negative. If the pins minus the vias is positive, the routine branches to the right and the total number of pins and vias from the left branch is carried over to the right branch. That is, the left-child pin/via counts are added to the totals of non-descendants that are left of the new current node (the right node). Step 212 in FIG. 12 generally states that branching occurs depending on the sign because the sign of the result can have different meaning depending on whether pins enclose vias or vice versa. Enclosing points are the type of points, pins or vias, of the leftmost and rightmost points. Enclosed points are the other type of points, vias or pins.

To summarize, let the difference (diff)×(number of enclosers to the left)−(number of enclosed to the left). If (diff <0), then the routine branches to the left. If (diff >0), then it branches right. Otherwise, it splits at this node.

When the result of this calculation is zero, the routine for partitioning a tree returns the current node z. This node can then be used as an input to another routine for reconstructing new left and right hull trees.

After the split, either side may still be nesting. The hull trees on each side of the split are reconstructed before continuing to find a non-nesting set of pins and vias.

Once the node z for partitioning a hull tree is found from the process illustrated in FIG. 12, new pairs of pin and via hull trees are reconstructed on each side of the partitioning line. To construct the new hull trees, the reconstruction routine copies the nodes on the path from the root of the original tree to z, putting one copy of each node in the new hull trees to the left and right of the line. Only these path nodes are in both of the new trees on the left and right of the line. All other nodes from the original hull tree belong to one of the new hull trees. Tangent edges along the path are recomputed in each tree by bottom up merging; no other tangent edges are effected. By using the old tangent end points as hints for finding the new tangent edges, new tangent edges can be found quickly.

Figure 13:
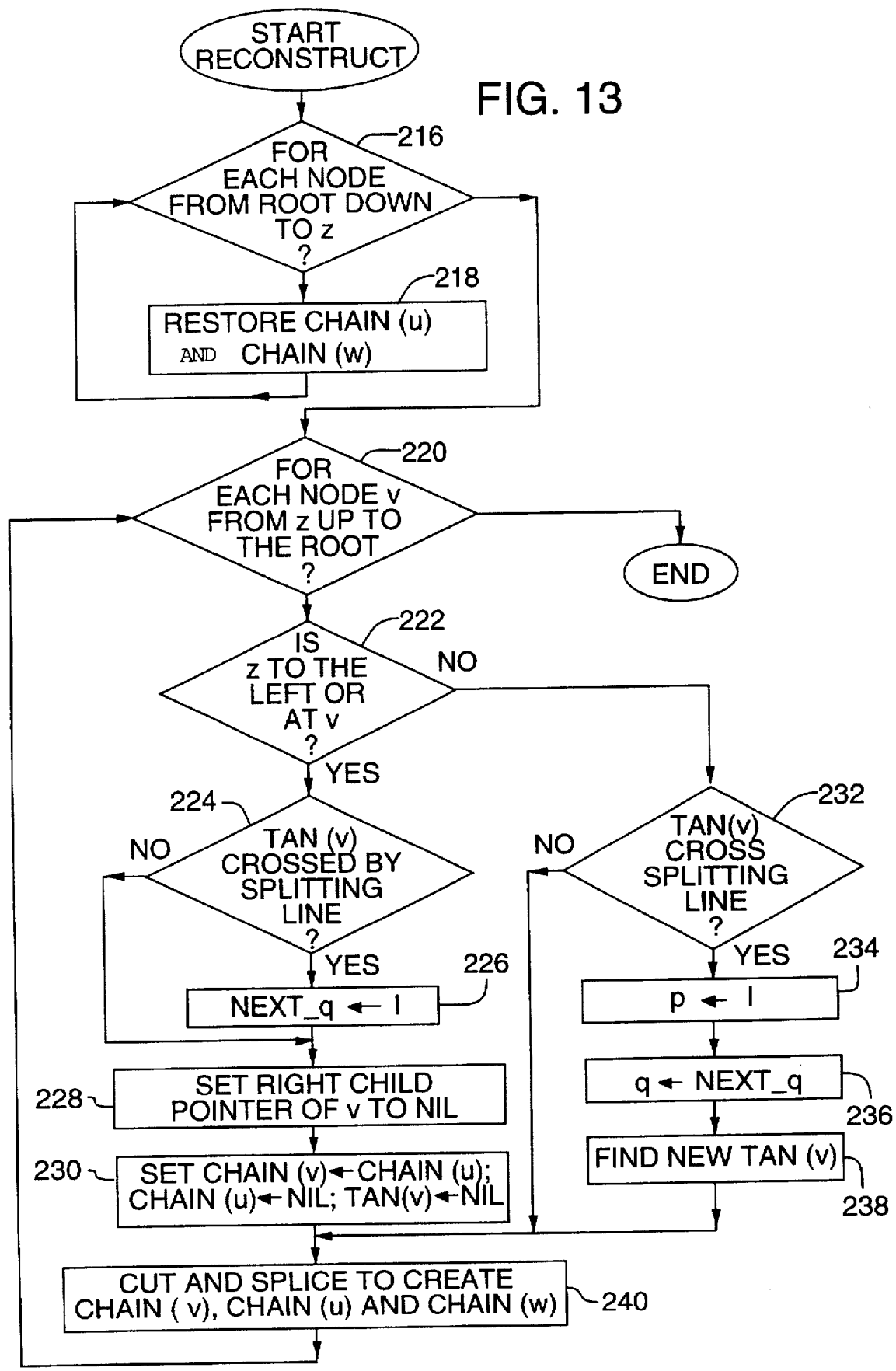
FIG. 13 is a flow diagram illustrating the steps executed to create a new hull tree split from another hull tree in an embodiment of the invention.
Figure 14A:
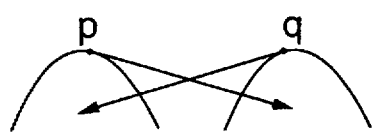
FIGS. 14A–D are diagrams illustrating how a procedure computes a common tangent between convex hulls in an embodiment of the invention.
Figure 14B:
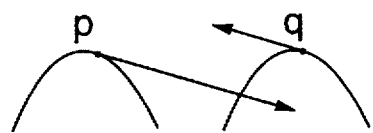
Figure 14C:
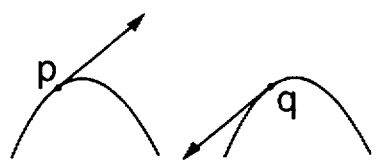
Figure 14D:
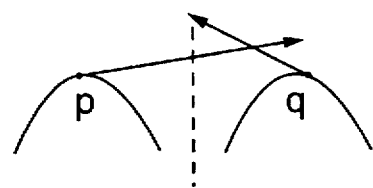

FIG. 13 illustrates how a new hull tree left of the splitting node z can be created. A similar process constructs the new hull tree right of z. In one implementation, these are combined into a single procedure that constructs both left and right hull trees simultaneously.

Before describing the reconstruction routine, we begin by defining the variables used in it. The path from the root node to z is stored in an array. In each loop through the reconstruction routine, the current node of the array is referred to as node v. Left and right children of v are u and w, respectively. The variables l and r are the previous left and right endpoints of tan(v), and may be recomputed during the reconstruction routine. The variables p and q represent points on the convex hulls of u and v from which a new search begins for the new tan(v). Chain(u), chain(w), tan(u), and tan(w) correctly represent convex hulls at u and w. The variable Next_q is a point on chain(w) that may be used as q in the future. The x-coordinate of a node v (or z) is defined to be just to the right of the right-most point in the descendants of the left child of v.

As a preliminary step, the left and right hull trees are restored for nodes along a path from the root down to z. In FIG. 13, this is illustrated with a loop beginning at step 216. For each node from the root down to z, the routine uses tan(v) to restore the left and right hull trees stored in chain(u) and chain(w), respectively (218).

After the left and right children are restored, the routine enters a second loop. Decision step 220 represents the beginning of this second loop in which the routine traces a path from z to the root node. Nodes are processed in bottom-to-top order from z up to the root. Each node in the array is processed in one of two ways, depending on whether z is to the left or right of v (222).

If the x-coordinate of z is to the left of or at the x-coordinate of v, then the routine proceeds according to steps 224–230. In this case, tan(v) does not exist in the new left hull tree being constructed. In step 224, it is determined whether the splitting line crosses tan(v). If so, next_q is set to l (226) and processing continues at block 228. If not, processing proceeds to block 228, where the right child pointer of v is set to NIL (228). Next, the chain(v) is set to chain(u), the chain from the left child node. Chain(u) and tan(v) are set to NIL (230).

If the x-coordinate of z is to the right of the x-coordinate of v, then the routine proceeds according to steps 232–238. In this case, if tan(v) crosses the splitting line i.e., r is to the right of z, then tan(v) must be recomputed (232). Before recomputing tan(v), p is set to l (234), and q is set to next_q (236). Then, tan(v) is recomputed using the technique described above (238). The tree is searched from p and q to find the new tangent edge tan(v). Let l' and r' be the endpoints of the new tan(v). Our construction guarantees that p is left of l', and q is left of r'. Hence, l' and r' can be found by a rightward scan from p and q, as in the original construction of tan(v) described above.

In the next step (240), a new chain(v) is stored at the node v and new fragments are stored at chain(u) and chain(w). The upper convex hull at a node v is the upper convex hull of the descendants of v. The upper convex hull of the descendants of v is stored as chain(v), and the fragments of the convex hulls of u and w that do not appear on the convex hull stored at node v are stored in chain(u) and chain(w).

After a non-nesting pair of upper convex hulls is computed for pins and vias, respectively, then the matching routine proceeds to find an upper common tangent between these upper convex hulls as shown in step 242 of FIG. 11. The common tangent between the upper convex hull for the pins and vias provides a non-crossing routing path between a pin-via pair.

There are a variety of alternative methods for finding a common tangent for two upper convex hulls separated by a vertical line. However, the preferred method is one which requires the least amount of processing. In this embodiment, the method for finding a common tangent can be executed in a time bound by O(logN), where N is the number of vertices in each hull tree.

The method for finding the common tangent conceptually proceeds as follows. The method begins with two points, p and q, where p is a vertex of the left hull, and q is a vertex of the right hull.

The next step is to find the line through p and its right neighbor, and the line through q and its left neighbor.

To clarify the next step, it is helpful to think of the lines passing through p and q as headlights of vehicles at p and q, heading toward each other on the respective hulls. A chain of vertices from the left or right hulls can potentially be eliminated from consideration based on examining these headlights. A vertex is said to be "eliminated" when it is determined that it cannot be an endpoint of the common tangent.

Table 1 below describes which hull vertices can be eliminated given the relative orientation of the "headlights." FIGS. 14A–D illustrate examples of vertices p and q and corresponding lines through these vertices on left and right hull trees. For each of the cases in Table 1 below, FIGS. 14A–D illustrate an associated example to show how the common tangent between left and right hull trees is computed.

TABLE 1

| ORIENTATION OF HEADLIGHTS | MEANING |
| --- | --- |
| Left pointing below q; right pointing below p (See FIG. 14A) | eliminate chain to the right of p on left hull tree, and eliminate chain to the left of q on the right hull tree |
| Left pointing below q; right pointing above p (See FIG. 14B) | eliminate chain to the right of p |
| Left pointing above q; right pointing below p (See FIG. 14C) | eliminate chain to the left of q |
| Left pointing above q; right pointing above p (See FIG. 14D) | look to the point of intersection of the two lines: If the point of intersection is to the right of the vertical line separating the two hull trees, then throw away the chain to the right of q. However, if the intersection is to the left of the vertical line, then throw away the chain to the left of p. |

The endpoints of the common tangent of the two hulls are found by repeatedly eliminating portions of the hulls until only the tangent endpoints remain. The procedure maintains the invariant that the un-eliminated candidates on each hull lie in a single subtree of the hull tree. The headlight lines are chosen to be the lines supporting the tangent edges stored at the two candidate hull tree nodes that are the roots of the subtrees. The analysis in Table 1 eliminates at least one child subtree of the two candidates; the procedure is repeated with one of the candidates replaced by its child. This continues until the tangent endpoints are reached.

If the hull trees representing pins and vias overlap, but do not nest, then the intersection point between the two hulls must be found before a common tangent can be computed. The intersection point is located in the interval where the two hull trees overlap. Before finding this intersection point, a ray extending to y =−∞ is assumed to extend from the left-most and right-most vertices of the left and right hulls. Since the hull trees overlap, but do not nest, the rays of the respective hull trees alternate as follows: left hull tree, right hull tree, left hull tree, and finally, right hull tree.

To find the edges of the hull trees that intersect, the nodes of the left and right hull trees are visited by traversing the binary tree representing both pins and vias. At each node, the y-coordinate of the right hull tree is subtracted from the y-coordinate of the left hull tree. The result of this calculation is undefined while outside the overlapping portion of the left and right hull trees. Depending on the result of this calculation, the search of the binary tree branches to the left or right of the binary tree to find the overlapping sections of the left and right hull trees.

The x-coordinate of a node v is defined as above. It is located just to the right of the rightmost leaf of the left subtree. As the routine descends through the left and right hull trees, it keeps track in each tree of the edge of the convex hull (represented by the hull tree) that crosses the vertical line through the x coordinate (x(v)) of the node. This convex hull edge is either tan(v) for the current node v, or is tan(a) for some ancestor a of v. As the routine descends through a tree, it keeps track of the ancestor convex hull edges L and R of v nearest to x(v).

If either L or R spans x(v), it is the convex hull edge at x=x(v). Otherwise tan(v) is the desired edge. Once the two convex hull edges that span x(v) are discovered, they are checked to determine whether they intersect. If so, the intersection point of the two convex hulls has been found. If not, the y coordinates of the point x(v) are subtracted, and the routine branches right or left in the direction that guarantees a crossing will be found.

After the intersection x' is found, the common tangent between left and right hulls is found as above with the following additional data. The vertical line x=x' is treated as a separating line between the left and right hulls. Half-chains on the far side of the line x=x' from a hull are always eliminated.

After a common tangent is computed, the endpoints of the common tangent are stored as a matching pin-via pair. Next, the endpoints are deleted from the hull trees, and the hull trees are reconstructed as reflected in step 244 of FIG. 11.

Figure 15A:
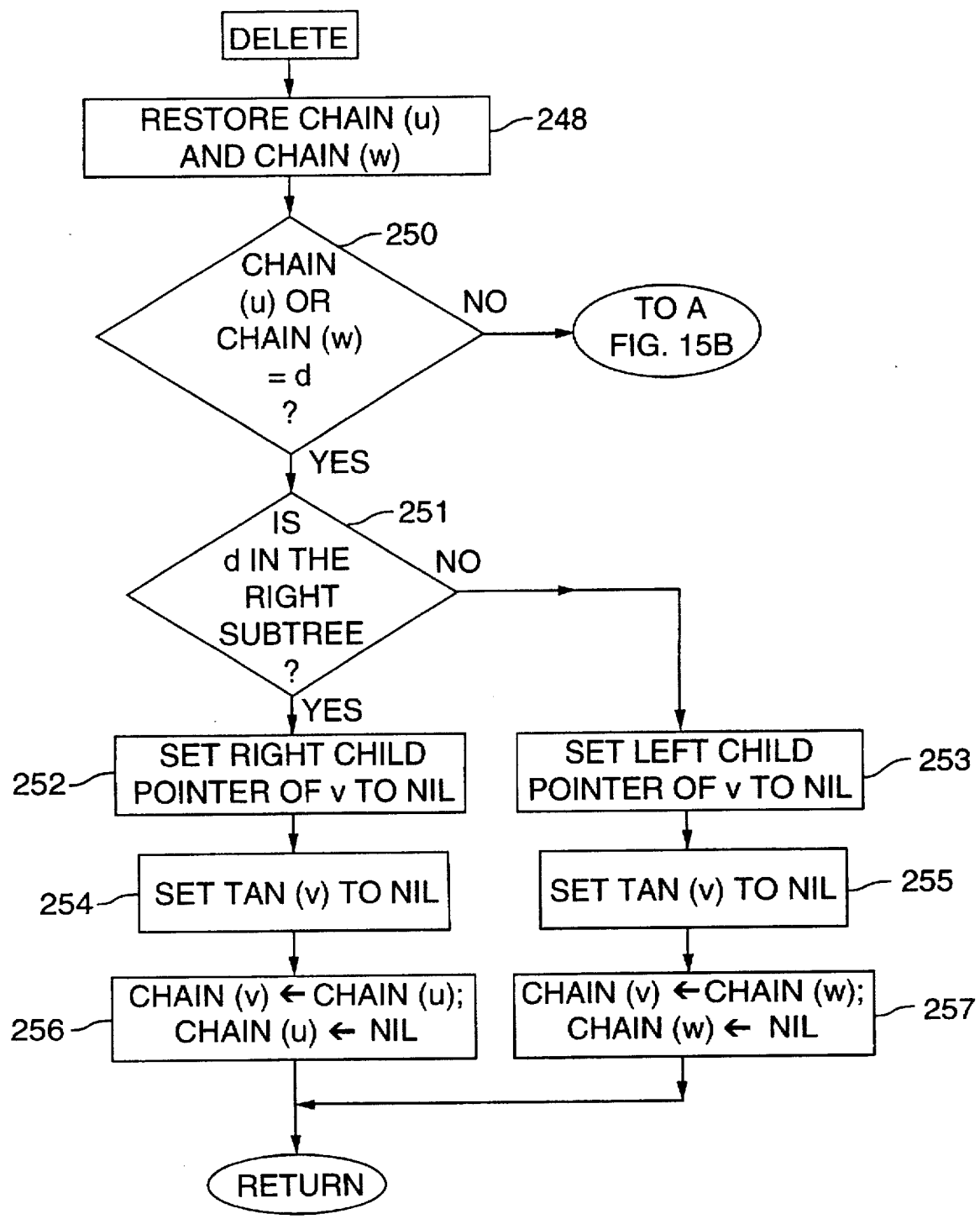
FIG. 15A–B are flow diagrams illustrating the steps executed to reconstruct a hull tree after deleting a point from the hull tree in an embodiment of the invention.
Figure 15B:
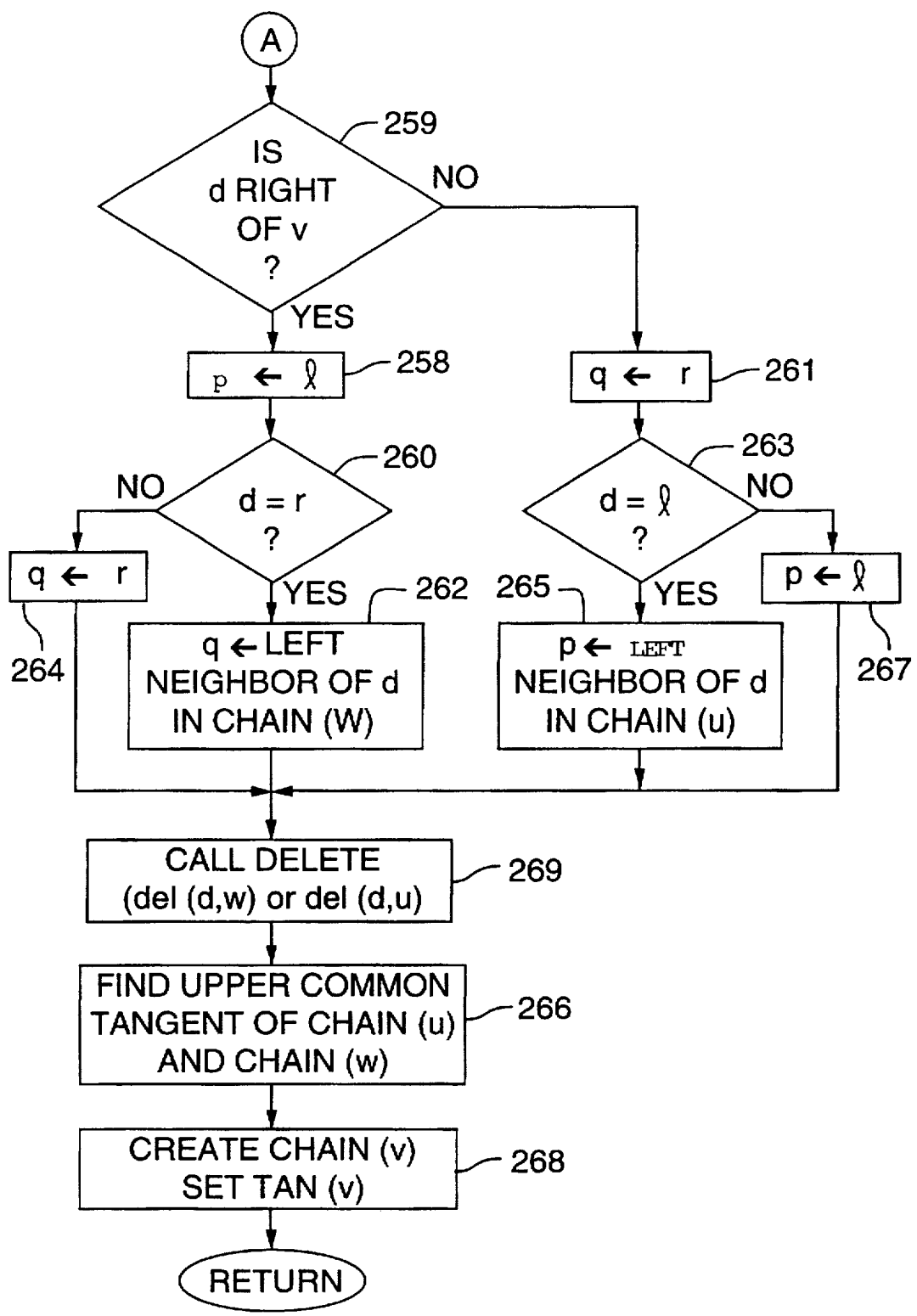

The method for reconstructing a hull tree given a deleted point, d, is illustrated in more detail in FIGS. 15A–B. Walking through each ancestor node in a root to leaf path to z, the delete routine updates each ancestor node of the leaf z containing d.

The first step for each node is to restore the left and right child hull trees, chain(u) and chain(w) (248). If chain(w) is the deleted point (i.e. there is only one point d in chain(w) (250)), then the fields for the node v are set as follows. In this case, d is in the right subtree (251). The right child pointer is set to NIL (252), tan(v) is set to NIL (254), chain(v) is set to chain(u), and chain(u) is set to NIL (256).

Similarly, if chain(u) is the deleted point (i.e. there is only one point d in chain(u)) (250), then the fields for the node v are set as follows. In this case, d is in the left subtree (251). The left child pointer is set to NIL (253), tan(v) is set to NIL (255), chain(v) is set to chain(w), and chain(w) is set to NIL (257).

If d is not the only point in chain(u) or chain(w), then p and q are set so that the new upper common tangent can be computed for the node (See FIG. 15B). As set forth above, p and q are inputs to a method for computing a common tangent between left and right hull trees separated by a line.

If d is to the right of v (259), then processing proceeds as follows. First, p is set to l, where l is the left endpoint of the common tangent (258). Next, if the deleted point d is equal to r (the right endpoint of the common tangent) (260), then q is set to the left neighbor of d in the right hull tree as shown in step 262. The right hull tree is stored in chain(w). If d is not equal to r, then q is set to r (264).

If d is to the left of v (259), then processing proceeds as follows. First, q is set to r, where r is the right endpoint of the common tangent (263). Next, if the deleted point d is equal to l (the left endpoint of the common tangent) (263), then p is set to the left neighbor of d in the left hull tree as shown in step 265. The left hull tree is stored in chain(u). If d is not equal to l, then p is set to l (267).

After p and q are set, then the delete routine recursively calls itself for either (d,w), if d was in the right subtree, or (d,u) if d was in the left subtree (269). Next, the common tangent for the hull trees chain(u) and chain(w) is computed using the same approach used to build the hull trees described above (266). Pointers to the endpoints of the common tangent are set for node v. Chain(v) representing an upper convex hull is created and stored at node v, while fragments hidden by this upper convex hull are stored in chain(u) and chain(w) in the left and right child nodes, respectively (268).

The delete routine terminates after it traces a path from the root of the hull tree to the immediate parent node of the leaf containing d. Returning again to FIG. 11, the matching routine loops back to decision step 198 and continues processing the current matching problem until the pins and vias are matched. Ultimately, the match routine terminates when each pin has been matched with a via.

After matching the pins and vias, paths between pin and via pairs are routed on a single layer using a detailed routing program. Any of a number of commercially available routing tools can be used to route these paths. One example is the LAYOUT™ placement and routing tool in Board Station® from Mentor Graphics Corporation of Wilsonville, Oreg.

The output of the matching process is a pin-via pairing. As input to the match routine, pins are stored in one array and vias are stored in another. The output of the match routine includes pairs of array indices identifying the pin/via pairs. This output can be used as input to a detailed router, which performs pin-via routing.

Matched pairs are sorted, shortest matching segment to the longest, and routed one at a time in that order using a detailed router. Each route acts as an obstacle to future routes, but a "shover" can be used to push wires aside when more space is needed. For instance, if the detailed router routes a path for first and second matching pin-via pairs, the intermediate result may not leave enough room for subsequent routing paths. In this case, the "shover" would move the existing routing paths as necessary to accommodate subsequent routing paths.

The design constraints for the routing problem act as design rules governing the routing process. Design constraints can include, for example, the wire width, track clearance (clearance between wires or between wires and pads), pad clearance (clearance between pads), and "diagonal routes allowed" (specifying whether the designer allows diagonal routing). The designer also specifies an optional routing grid. For example, the designer may specify a pin grid, a via grid, and a wire grid. These grids enable a user to specify a uniform grid to the router that the router must use to route traces.

The detailed router determines whether adding another routing path between a pin and via will satisfy the design constraints as it routes the paths one at a time. If not, the shover can be used to move existing paths aside to accommodate subsequent paths.

The detailed routing program can swap pin-via pairs to reduce the total routing length of the routing paths. The routing program swaps selected pin and via pairs and then recomputes the total routing length. If two pairs (p,v) and (p',v') are near each other in the plane, and the total length of the pairs (p,v') and (p',v) is less, the routing program considers swapping the pin-via pairs.

The output of the detailed router can be written to a file specifying the location of the routing paths, pins and vias in (x,y) coordinates and layer assignments. The data in this file can be processed for display or printing using conventional electronic design tools.

While we have described in detail an embodiment of the invention, it should be understood that the implementation of the invention can vary. For example, the implementation of the specific routines above can vary. These routines are provided to illustrate one embodiment only and other alternative implementations are possible.

The method described above for matching pins and vias can also be used to generate wire bond connections. In conventional wire bond technology, a component is electrically connected to a mounting surface such as a substrate or printed circuit board by wires from the component to the mounting surface. Consider for example, a Multi-Chip Module (MCM) where a chip is wired to a substrate using a wire bond process. Assume that the chip has pads on its top surface that need to be connected to pads on the substrate surface. The pads on the chip and substrate surface are referred to as inner bond leads and outer bond leads, respectively. In a wire bond process, the inner bond leads on the surface of a chip are wired to outer bond leads on the substrate surface. The manufacturing process used to make these connections does not allow wires to overlap. As such, the projection of the wire bond connections into the plane of the mounting surface cannot cross.

To ensure that the wire bond connections do not cross, the method described above can be used to generate non-crossing paths corresponding to the projection of the wire bonds into the plane of the mounting surface. The inputs to the matching routing are not pin and via coordinates, but instead, the coordinates of the inner and outer bond leads. The output of the matching process in this case is a set of matched inner and outer bond leads. The matching pairs do not have to be routed, as in the case of the breakout routing application, because the wire bonds connect matched pairs directly.

In view of the many possible embodiments to which the principles of our invention may be put, it is emphasized that the detailed embodiment described herein is illustrative only and should not be taken as limiting the scope of our invention. Rather, we claim as our invention all such embodiments as may come within the scope and spirit of the following claims and equivalents thereto.

We claim:

1. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair.

2. The method of claim I further including the step of:

before creating the first and second convex hull structures, selectively eliminating vias so that the number of pins equals the number of vias.

3. A method for routing breakouts between pins and vias in an electrical circuit design, comprising:

creating a first convex hull structure representing pins and a second convex hull representing vias from coordinates of the pins and vias stored in memory of a programmed computer system;

performing the following steps on the first and second convex hull structures repeatedly to find matching pin-via pairs:

finding a common tangent between the first and second convex hull structures having a first endpoint in the first convex hull structure and a second endpoint in the second convex hull structure;

storing the first and second endpoints of the first common tangent as a matching pin-via pair;

reconstructing the first and second convex hull structures after removing the first and second endpoints from the respective convex hull structures; and routing the matching pin-via pairs using the first and second endpoints of the common tangent.

4. A computer-readable medium on which is stored a computer program for routing breakouts, said computer program comprising instructions, which when executed by a computer, perform the steps of:

creating a first convex hull structure representing the pins and a second convex hull structure representing the vias from coordinates of the pins and the vias;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair.

5. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

determining whether the pins nest within the vias, and determining whether the vias nest within the pins; and if either the pins nest the vias, or the vias nest the vias, then splitting the first and second convex hull structures so that the pins and vias do not nest;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair.

6. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair;

routing a first path between the first pin and via pair, and routing a second path between the second pin and via pair; and swapping the first and second routing paths to reduce total routing length.

7. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

creating a binary tree structure representing an ordered set of the pins and vias, the binary tree structure having leaves representing the coordinates of pins or vias, wherein the first and second convex hull structures are created from the binary tree structure;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair.

8. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair;

wherein the first and second convex hull structures are binary tree structures including:

leaves having data fields for representing the coordinates of pins or vias;

nodes having data fields for representing an upper convex hull for the descendant leaves of the nodes; and a root node having a data field for representing an upper convex hull of all active pins or vias in the convex hull structure.

9. A computer-assisted method for routing breakouts between pins and vias, comprising:

reading coordinates of pins and vias from memory of a programmed computer system;

creating a first convex hull structure representing the pins and a second convex hull structure representing the vias from the coordinates of the pins and the vias;

before creating the first and second convex hull structures, placing the vias on a mounting surface according to predefined design constraints, and storing the coordinates of the vias;

finding a common tangent between the first and second convex hull structures having a first endpoint in the first convex hull structure and a second endpoint in the second convex hull structure;

storing the first and second endpoints of the common tangent between the first and second convex hull structures as a first matching pin and via pair;

removing the first and second endpoints from the first and second convex hull structures respectively;

reconstructing the first and second convex hull structures to find first and second reconstructed convex hull structures;

finding a common tangent between the first and second reconstructed convex hull structures having a first endpoint in the first reconstructed convex hull structure and a second endpoint in the second reconstructed convex hull structure;

storing the first and second endpoints of the common tangent between the first and second reconstructed convex hull structures as a second matching pin and via pair; and routing a first path between the first pin and via pair, and routing a second path between the second pin and via pair.

* * * * *